(12) United States Patent
Xu et al.

(10) Patent No.: US 12,232,400 B2
(45) Date of Patent: Feb. 18, 2025

(54) DISPLAY PANEL AND METHOD FOR MANUFACTURING THE SAME, AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Pan Xu, Beijing (CN); Zhidong Yuan, Beijing (CN); Yongqian Li, Beijing (CN); Can Yuan, Beijing (CN)

(73) Assignees: Hefei BOE Joint Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/640,530

(22) PCT Filed: Apr. 29, 2021

(86) PCT No.: PCT/CN2021/091175
§ 371 (c)(1),
(2) Date: Mar. 4, 2022

(87) PCT Pub. No.: WO2022/226939
PCT Pub. Date: Nov. 3, 2022

(65) Prior Publication Data
US 2024/0049569 A1    Feb. 8, 2024

(51) Int. Cl.
*H10K 59/80* (2023.01)
*H10K 59/12* (2023.01)
*H10K 59/124* (2023.01)

(52) U.S. Cl.
CPC ....... *H10K 59/873* (2023.02); *H10K 59/1201* (2023.02); *H10K 59/124* (2023.02); *H10K 59/80523* (2023.02)

(58) Field of Classification Search
CPC .................................................. H10K 59/873
See application file for complete search history.

(56) References Cited

U.S. PATENT DOCUMENTS

| 10,347,866 B1 | 7/2019 | Kim | |
|---|---|---|---|
| 2014/0117341 A1* | 5/2014 | Song | H10K 50/844 |
| | | | 438/46 |

(Continued)

FOREIGN PATENT DOCUMENTS

| CN | 106409869 A | 2/2017 |
|---|---|---|
| CN | 109802052 A | 5/2019 |

(Continued)

OTHER PUBLICATIONS

Machine translation of CN 111293155A (Year: 2020).*

*Primary Examiner* — Erik Kielin
(74) *Attorney, Agent, or Firm* — The Webb Law Firm

(57) ABSTRACT

Provided are a display panel and a method for manufacturing the same, and a display device. The display panel includes: a base substrate including a display area and a peripheral area; a separator located at the peripheral area and including at least one separation portion, each separation portion including a first and a second separation layer, and the orthographic projection of the first separation layer on the base substrate is within that of the second separation layer; a cathode including: a first cathode portion, and a second cathode apart from the first cathode portion; and an encapsulation layer including a first and a second inorganic layer, and an organic layer located between the first and the second inorganic layer, wherein edges of the orthographic projections of the first inorganic layer, the organic layer, and the second inorganic layer on the base substrate overlap.

19 Claims, 10 Drawing Sheets

(56) References Cited

U.S. PATENT DOCUMENTS

| | | |
|---|---|---|
| 2016/0013441 A1 | 1/2016 | Hong |
| 2017/0033312 A1 | 2/2017 | Kim et al. |
| 2021/0043872 A1 | 2/2021 | Gao |
| 2021/0134910 A1 | 5/2021 | Yang et al. |
| 2021/0225992 A1 | 7/2021 | Long et al. |
| 2021/0408508 A1* | 12/2021 | Zhang ............... H10K 59/873 |
| 2022/0069054 A1 | 3/2022 | Zhang et al. |

FOREIGN PATENT DOCUMENTS

| | | | | |
|---|---|---|---|---|
| CN | 109935601 A | 6/2019 | | |
| CN | 109935621 A | 6/2019 | | |
| CN | 209071332 U | 7/2019 | | |
| CN | 110120464 A | 8/2019 | | |
| CN | 110429207 A | 11/2019 | | |
| CN | 110676302 A | 1/2020 | | |
| CN | 111293155 A * | 6/2020 | ......... | H01L 27/3276 |
| CN | 111477770 A | 7/2020 | | |
| WO | 2021017011 A1 | 2/2021 | | |

* cited by examiner

DISPLAY PANEL AND METHOD FOR MANUFACTURING THE SAME, AND DISPLAY DEVICE

CROSS-REFERENCE TO RELATED APPLICATION

This application is the United States National Phase Application under 35 U.S.C. § 371 of International Patent Application No. PCT/CN2021/091175, filed on Apr. 29, 2021, the disclosure of which is hereby incorporated by reference in its entirety.

TECHNICAL FIELD

The present disclosure relates to a display panel and a method for manufac58U8826.DOCX58U8826.DOCXturing the same, and a display device.

BACKGROUND

The OLED (Organic Light-Emitting Diode) has characteristics such as active light emission, high luminous brightness, high resolution, wide viewing angle, fast response speed, low energy consumption and flexibility. Therefore, the OLED-based display technology might become the next-generation display technology as a substitution of the liquid crystal display technology.

SUMMARY

According to one aspect of the embodiments of the present disclosure, a display panel is provided. The display panel comprises: a base substrate comprising a display area and a peripheral area surrounding the display area; a separator located at the peripheral area, the separator comprising at least one separation portion at least partially surrounding the display area, wherein each of the at least one separation portion comprises a first separation layer and a second separation layer sequentially stacked on the base substrate, and a first orthographic projection of the first separation layer on the base substrate is within a second orthographic projection of the second separation layer on the base substrate; a cathode comprising: a first cathode portion located on one side of the separator close to the display area, and a second cathode portion located on one side of the separator away from the display area and spaced apart from the first cathode portion; and an encapsulation layer located on one side of the cathode away from the base substrate, and comprising a first inorganic layer, a second inorganic layer, and an organic layer located between the first inorganic layer and the second inorganic layer, wherein an edge of an orthographic projection of the first inorganic layer on the base substrate, an edge of an orthographic projection of the organic layer on the base substrate, and an edge of an orthographic projection of the second inorganic layer on the base substrate overlap.

In some embodiments, the peripheral area comprises a bonding area and a non-bonding area other than the bonding area, wherein the bonding area surrounds a first edge of an edge of the display area, and the non-bonding area surrounds a second edge of the edge of the display area other than the first edge; and each of the at least one separation portion comprises a first separation portion located at the non-bonding area and surrounding the second edge.

In some embodiments, each of the at least one separation portion further comprises: a second separation portion located at the bonding area and connected to one end of the first separation portion; and a third separation portion located at the bonding area and connected to the other end of the first separation portion, wherein the third separation portion and the second separation portion each extends in a direction away from the display area.

In some embodiments, the display panel further comprises: a pad located at the bonding area; and at least one dam located at the bonding area and located between the first edge and the pad, wherein the at least one dam extends along a direction from the second separation portion to the third separation portion, wherein: the encapsulation layer is located on one side of the at least one dam away from the base substrate, an orthographic projection of the pad on the base substrate is outside an orthographic projection of the encapsulation layer on the base substrate, and an orthographic projection of the at least one dam on the base substrate is within the orthographic projection of the encapsulation layer on the base substrate.

In some embodiments, the at least one dam is located between the cathode and the pad.

In some embodiments, the at least one dam comprises a plurality of dams arranged at intervals in a direction from the first edge to the pad.

In some embodiments, the display panel further comprises: a glue portion located at the bonding area and located between the at least one dam and the pad; a glue layer located on one side of the encapsulation layer away from the base substrate; and a cover plate located on one side of the glue layer away from the base substrate.

In some embodiments, each of the at least one separation portion further comprises: a third separation layer located between the first separation layer and the base substrate, wherein the first orthographic projection is within a third orthographic projection of the third separation layer on the base substrate.

In some embodiments, each of the at least one separation portion further comprises: a support layer located between the third separation layer and the base substrate, wherein the first orthographic projection, the second orthographic projection, and the third orthographic projection are within an orthographic projection of the support layer on the base substrate.

In some embodiments, each of the at least one separation portion further comprises: a first conductive portion located on one side of the second separation layer away from the base substrate, wherein an orthographic projection of the first conductive portion on the base substrate is within the second orthographic projection.

In some embodiments, the display panel further comprises: a power line located at the peripheral area, located between the support layer and the base substrate, and connected to each of the at least one separation portion; and a second conductive portion located between the separator and the display area, located between the first cathode portion and the power line, in contact with the first cathode portion, and connected to the power line.

In some embodiments, the display panel further comprises: a first insulating layer comprising a first insulating portion located at the peripheral area, wherein the first insulating portion is located between the support layer and the power line; a second insulating layer comprising a second insulating portion located at the peripheral area, wherein the second insulating portion is located between the support layer and the first insulating portion; a third insulating layer comprising a third insulating portion located at the peripheral area, wherein the third insulating portion is located between the support layer and the third separation layer; and a fourth insulating layer comprising a fourth insulating portion located at the peripheral area, wherein the fourth insulating portion is located between the second separation layer and the first conductive portion, wherein each of the at least one separator further comprises: a first connecting portion penetrating through the second insulating portion and the first insulating portion, and connected to the support layer and the power line, a second connecting portion penetrating through the third insulating portion, and connected to the third separation layer and the support layer, and a third connecting portion penetrating through the fourth insulating portion, and connected to the first conductive portion and the second separation layer.

In some embodiments, the display panel further comprises: a connecting layer located between the second conductive portion and the power line, and located between the separator and the display area, the connecting layer comprising: a first connecting layer located between the second conductive portion and the power line, and a second connecting layer located between the second conductive portion and the first connecting layer; at least one fourth connecting portion penetrating through the second insulating portion and the first insulating portion, and connected to the first connecting layer and the power line; at least one fifth connecting portion penetrating through the third insulating portion, and connected to the second connecting layer and the first connecting layer; and at least one sixth connecting portion penetrating through the fourth insulating portion, and connected to the second conductive portion and the second connecting layer.

In some embodiments, an orthographic projection of the first connecting layer on the base substrate is within an orthographic projection of the second connecting layer on the base substrate.

In some embodiments, the first connecting portion and the support layer are integrally provided; the second connecting portion and the third separation layer are integrally provided; the third connecting portion and the first conductive portion are integrally provided; the at least one fourth connecting portion and the first connecting layer are integrally provided; the at least one fifth connecting portion and the second connecting layer are integrally provided; and the at least one sixth connecting portion and the second conductive portion are integrally provided.

In some embodiments, the cathode further comprises: a third cathode portion located on one side of each of the at least one separation portion away from the base substrate, and spaced apart from the first cathode portion and the second cathode portion.

In some embodiments, the at least one separation portion comprises a plurality of separation portions, and the cathode further comprises: a fourth cathode portion located between two adjacent separation portions of the plurality of separation portions and spaced apart from the third cathode portion.

In some embodiments, the display panel further comprises a functional layer located between the cathode and the base substrate, the functional layer comprising at least one of an electron transport layer or an electron injection layer, the functional layer comprising: a first functional portion located on one side of the separator close to the display area; and a second functional portion located on one side of the separator away from the display area and spaced apart from the first functional portion.

In some embodiments, an edge of the first orthographic projection close to the display area does not overlap with an edge of the second orthographic projection close to the display area; and an edge of the first orthographic projection away from the display area does not overlap with an edge of the second orthographic projection away from the display area.

In some embodiments, a minimum distance between an edge of the first orthographic projection and an edge of the second orthographic projection is 1 micrometer to 3 micrometers.

In some embodiments, a material of each of the second separation layer and the third separation layer comprises titanium, and a material of the first separation layer comprises aluminum.

According to another aspect of the embodiments of the present disclosure, provided is a display device, comprising the display panel according to any one of the above embodiments.

According to still another aspect of the embodiments of the present disclosure, provided is a method for manufacturing a display panel, comprising: providing a base substrate comprising a display area and a peripheral area surrounding the display area; forming a separator located at the peripheral area, the separator comprising at least one separation portion at least partially surrounding the display area, wherein each of the at least one separation portion comprises a first separation layer and a second separation layer sequentially stacked on the base substrate, and a first orthographic projection of the first separation layer on the base substrate is within a second orthographic projection of the second separation layer on the base substrate; forming a cathode, the cathode comprising: a first cathode portion located on one side of the separator close to the display area, and a second cathode portion located on one side of the separator away from the display area and spaced apart from the first cathode portion; and forming an encapsulation layer on one side of the cathode away from the base substrate, the encapsulation layer comprising a first inorganic layer, a second inorganic layer, and an organic layer located between the first inorganic layer and the second inorganic layer, wherein an edge of an orthographic projection of the first inorganic layer on the base substrate, an edge of an orthographic projection of the organic layer on the base substrate, and an edge of an orthographic projection of the second inorganic layer on the base substrate overlap.

In some embodiments, each of the at least one separation portion further comprises: a third separation layer located between the first separation layer and the base substrate, wherein the first orthographic projection is within a third orthographic projection of the third separation layer on the base substrate; a support layer located between the third separation layer and the base substrate, wherein the first orthographic projection, the second orthographic projection, and the third orthographic projection are within an orthographic projection of the support layer on the base substrate; and a first conductive portion located on one side of the second separation layer away from the base substrate, wherein an orthographic projection of the first conductive portion on the base substrate is within the second orthographic projection.

In some embodiments, forming the separator comprises: forming at least one initial separator on the base substrate, each of the at least one initial separator comprising the support layer, the third separation layer, a first initial separation layer and the second separation layer sequentially stacked on the base substrate, wherein an edge of an orthographic projection of the first initial separation layer on the base substrate close to the display area, an edge of an orthographic projection of the second separation layer on the base substrate close to the display area, and an edge of an orthographic projection of the third separation layer on the base substrate close to the display area overlap, and an edge of the orthographic projection of the first initial separation layer on the base substrate away from the display area, an edge of the orthographic projection of the second separation layer on the base substrate away from the display area, and an edge of the orthographic projection of the third separation layer on the base substrate away from the display area overlap; and forming the first conductive portion and etching at least one of a first side surface of the first initial separation layer close to the display area or a second side surface of the first initial separation layer away from the display area to form the first separation layer.

In some embodiments, forming the first conductive portion and etching at least one of a first side surface of the first initial separation layer close to the display area or a second side surface of the first initial separation layer away from the display area comprises: forming a fourth insulating portion on one side of the second separation layer away from the base substrate, wherein the fourth insulating portion defines an opening that exposes a part of a surface of the second separation layer away from the base substrate, and wherein after the fourth insulating portion is formed, the first side surface and the second side surface are exposed; forming a conductive material layer partially located in the opening and covering the first side surface and the second side surface; and performing a wet etching on the conductive material layer to obtain the first conductive portion partially in the opening, wherein at least one of the first side surface or the second side surface is etched during the wet etching to obtain the first separation layer.

In some embodiments, forming the first conductive portion and etching at least one of a first side surface of the first initial separation layer close to the display area or a second side surface of the first initial separation layer away from the display area comprises: forming a fourth insulating material layer covering the first side surface and the second side surface, wherein the fourth insulating material layer defines an opening that exposes a part of a surface of the second separation layer away from the base substrate; forming a conductive material layer partially located in the opening and covering the fourth insulating material layer; and performing a first wet etching on the conductive material layer to obtain the first conductive portion partially in the opening; performing a dry etching on the fourth insulating material layer to expose the first side surface and the second side surface; and performing a second wet etching on at least one of the first side surface or the second side surface to obtain the first separation layer.

In some embodiments, the base substrate further comprises a sacrificial area, the method further comprising: forming an initial glue portion on the sacrificial area and the peripheral area, wherein the display area is within a space defined by the initial glue portion, and an orthographic projection of the initial glue portion on the base substrate is a regular pattern; filling an initial glue layer in the space after the encapsulation layer is formed; forming a cover plate on one side of the initial glue layer away from the base substrate; and performing a cutting process to remove the sacrificial area, a part of the initial glue portion located on the sacrificial area, a part of the initial glue layer located above the sacrificial area, and a part of the cover plate located above the sacrificial area, wherein a part of the initial glue portion located on the peripheral area serves as a glue portion, and a remaining part of the initial glue layer serves as a glue layer.

BRIEF DESCRIPTION OF THE ACCOMPANYING DRAWINGS

The accompanying drawings which constitute part of this specification, illustrate the embodiments of the present disclosure, and together with this specification, serve to explain the principles of the present disclosure.

The present disclosure may be more explicitly understood from the following detailed description with reference to the accompanying drawings, in which.

Figure 1A:
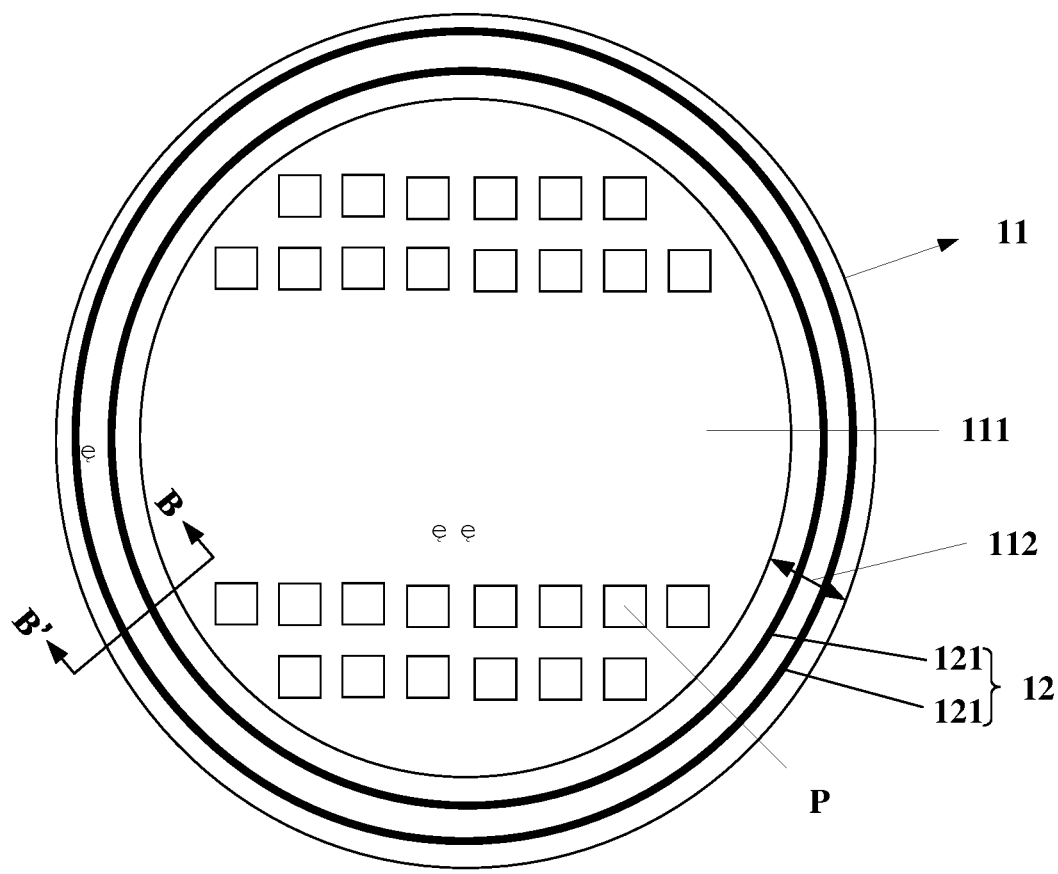
FIG. 1A is a schematic top view showing a display panel according to some embodiments of the present disclosure.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that in the related art, some layers such as cathode extend from a display area to a peripheral area, which results in that water vapor and oxygen are likely to enter the display area through these layers, thereby affecting the display effect of the display panel.

In view of this, the embodiments of the present disclosure provide the following technical solutions.

Figure 1B:
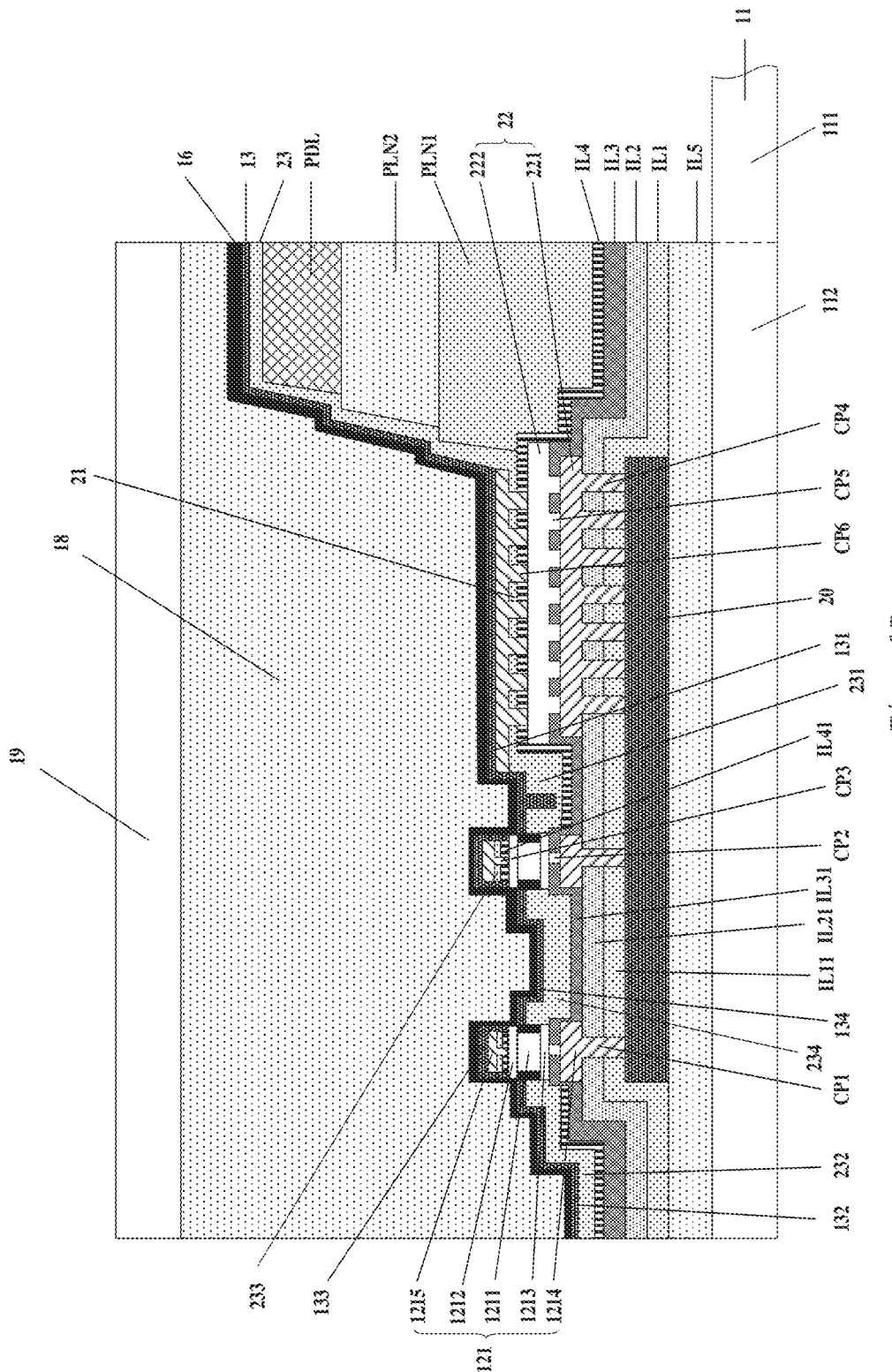
FIG. 1B is a schematic cross-sectional view taken along B-B' shown in FIG. 1A.
Figure 1C:
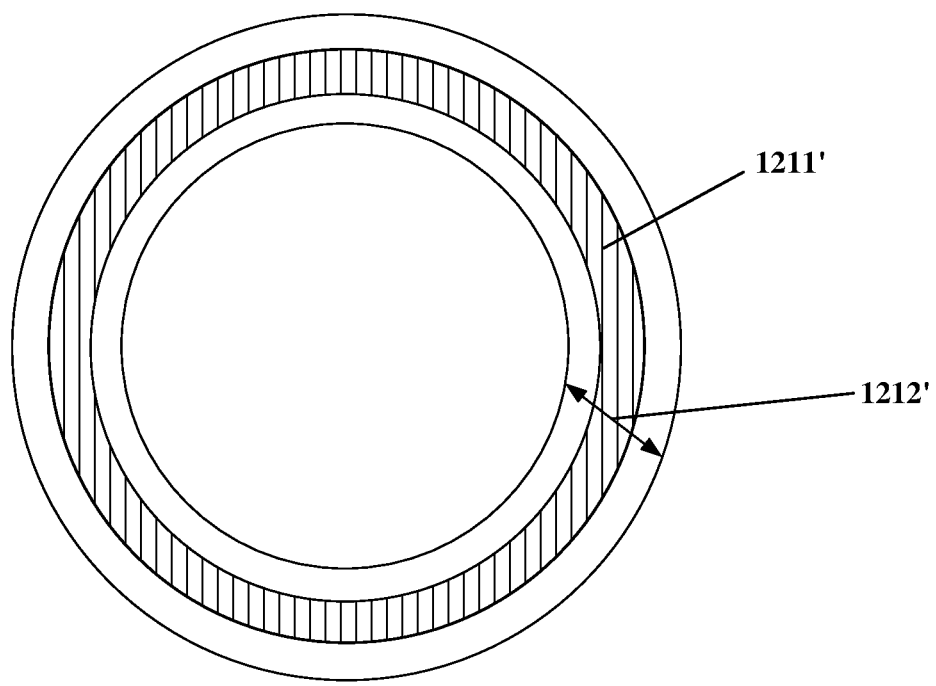
FIG. 1C is a schematic view showing a first orthographic projection and a second orthographic projection according to some embodiments of the present disclosure.
Figure 1D:
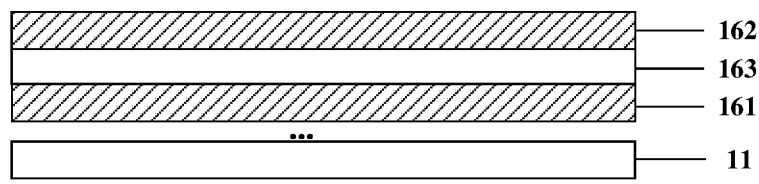
FIG. 1D is a schematic cross-sectional view showing an encapsulation layer according to some embodiments of the present disclosure.

FIG. 1A is a schematic top view showing a display panel according to some embodiments of the present disclosure. FIG. 1B is a schematic cross-sectional view taken along B-B' shown in FIG. 1A. FIG. 1C is a schematic view showing a first orthographic projection and a second orthographic projection according to some embodiments of the present disclosure. FIG. 1D is a schematic cross-sectional view showing an encapsulation layer according to some embodiments of the present disclosure.

Hereinafter, the display panel according to some embodiments of the present disclosure will be introduced in conjunction with FIGS. 1A to 1D.

As shown in FIGS. 1A and 1B, the display panel comprises a base substrate 11, a separator 12, a cathode 13 and an encapsulation layer 16.

Referring to FIG. 1A, the base substrate 11 comprises a display area 111 and a peripheral area 112 surrounding the display area 111. Here, the display area 111 is schematically shown to be substantially in a shape of circle, and the peripheral area 112 is schematically shown to be substantially in a shape of circular ring. It should be understood that the embodiments of the present disclosure are not limited thereto. For example, the display area 111 may be substantially in an irregular shape such as a heart shape. For example, the display area 111 may be substantially in a shape of rectangular, and the peripheral area 112 may be substantially in a shape of rectangular ring. In some embodiments, the base substrate 11 may comprise a flexible substrate, such as a polyimide (PI) substrate or the like.

A plurality of sub-pixels P of the display panel is located at the display area 111. For example, the plurality of sub-pixels P comprises a red sub-pixel, a green sub-pixel, and a blue sub-pixel.

The separator 12 is located at the peripheral area 112. Here, the separator 12 comprises at least one separation portion 121 at least partially surrounding the display area 111. FIG. 1A shows a case where the separator 12 completely surrounds the display area 111. It should be understood that in a case where the separator 12 comprises a plurality of separation portions 121, the plurality of separation portions 121 is spaced apart from each other in a direction from the display area 111 to the peripheral area 112.

Referring to FIG. 1B, each separation portion 121 comprises a first separation layer 1211 and a second separation layer 1212 sequentially stacked on the base substrate 11. Referring to FIG. 1C, the first orthographic projection 1211' of the first separation layer 1211 on the base substrate 11 is within the second orthographic projection 1212' of the second separation layer 1212 on the base substrate 11. In some embodiments, the material of the first separation layer 1211 comprises aluminum, and the material of the second separation layer 1212 comprises titanium.

Continuing to refer to FIG. 1B, the cathode 13 comprises a first cathode portion 131 and a second cathode portion 132 spaced apart from the first cathode portion 131. Here, the first cathode portion 131 is located on one side of the separator 12 close to the display area 111, and the second cathode portion 132 is located on one side of the separator 12 away from the display area 111. In other words, two portions of the cathode 13 located on both sides of the separator 12 are spaced apart. In some embodiments, the first cathode portion 131 extends from the display area 111 to the peripheral area 112, and the plurality of sub-pixels P shares the first cathode portion 131.

Referring to FIG. 1B, the encapsulation layer 16 is located on one side of the cathode 13 away from the base substrate 11. Referring to FIG. 1D, the encapsulation layer 16 comprises a first inorganic layer 161, a second inorganic layer 162, and an organic layer 163 located between the first inorganic layer 161 and the second inorganic layer 162. The edge of the orthographic projection of the first inorganic layer 161 on the base substrate 11, the edge of the orthographic projection of the organic layer 163 on the base substrate 11 and the edge of the orthographic projection of the second inorganic layer 162 on the base substrate 11 overlap. It should be understood that the term "overlap" here refers to completely overlap. In other words, the orthographic projections of the first inorganic layer 161, the second inorganic layer 162, and the organic layer 163 on the base substrate 11 are the same.

In the above embodiments, the peripheral area 112 is provided with a separator 12 comprising at least one separation portion 121, each separation portion 121 comprises a first separation portion 1211 and a second separation portion 1212, and the first cathode portion 131 and the second cathode portion 132 of the cathode 13 located on both sides of the separator 12 are spaced apart. Such a structure helps to block water vapor and oxygen from entering the display area 111 through the cathode 13, thereby reducing the adverse effect of water vapor and oxygen on the display panel and improving the display effect of the display panel.

In some embodiments, the number of separation portions 121 in the separator 12 is greater than or equal to 7, for example, 15, 20, 25, etc. In this way, water vapor and oxygen can be blocked from entering the display area 111 through the cathode 13 more effectively, thereby further improving the display effect of the display panel. In some embodiments, the number of separation portions 121 in the separator 12 is greater than or equal to 30, for example, 35, 40, 50, etc. In this way, water vapor and oxygen can be blocked from entering the display area 111 through the cathode 13 more effectively, thereby still further improving the display effect of the display panel.

In some embodiments, the minimum distance between two adjacent separation portions 121 in the separator 12 is greater than or equal to 10 micrometers and less than or equal to 15 micrometers, for example, 12 micrometers, 14 micrometers, etc. In this way, the cathode 13 can be partitioned into different parts more effectively.

In some embodiments, as shown in FIG. 1C, the edge of the first orthographic projection 1211' does not overlap with the edge of the second orthographic projection 1212'. In other words, a side surface of the first separation layer 1211 close to the display area 111 is more away from the display area 111 than a side surface of the second separation layer 1212 close to the display area 111, and a side surface of the first separation layer 1211 away from the display area 111 is closer to the display area 111 than a side surface of the second separation layer 1212 away from the display area 111. Accordingly, it is more helpful to partition the cathode 13.

As some implementations, the minimum distance between an edge of the first orthographic projection 1211' away from the display area 111 and an edge of the second orthographic projection 1212' away from the display area 111 is 1 micrometer to 3 micrometers, for example, 1.5 micrometers, 2 micrometers, and 2.5 micrometers, etc. Within such a range, a portion of the second separation layer 1212 that does not cover the first separation layer 1211 is not likely to collapse, thereby ensuring that the cathode 13 can be partitioned into different portions, and further improving the display effect of the display panel.

In addition to the first cathode portion 131 and the second cathode portion 132, the cathode 13 may also be partitioned into more portions, which will be described below in conjunction with different embodiments.

In some embodiments, referring to FIG. 1B, in addition to the first cathode portion 131 and the second cathode portion 132, the cathode 13 further comprises a third cathode portion 133. The third cathode portion 133 is located on one side of each separation portion 121 away from the base substrate 11 and spaced apart from the first cathode portion 131 and the second cathode portion 132. Such a structure is more favorable to block water vapor and oxygen from entering the display area 111 through the cathode 13, thereby further reducing the adverse effect of water vapor and oxygen on the display panel, and thus further improving the display effect of the display panel.

In other embodiments, the separator 12 comprises a plurality of separation portions 121. Referring to FIG. 1B, in addition to the first cathode portion 131, the second cathode portion 132 and the third cathode portion 133, the cathode 13 further comprises a fourth cathode portion 134. The fourth cathode portion 134 is located between two adjacent separation portions 121 of the plurality of separation portions 121 and spaced apart from the third cathode portion 133. Such a structure is more favorable to block water vapor and oxygen from entering the display area 111 through the cathode 13, thereby further reducing the adverse effect of water vapor and oxygen on the display panel, and thus further improving the display effect of the display panel.

In addition to the cathode 13, certain layer or some layers between the cathode 13 and the base substrate 11 may also be partitioned into different portions.

In some embodiments, referring to FIG. 1B, the display panel further comprises a functional layer 23 located between the cathode 13 and the base substrate 11. Here, the functional layer 23 comprises at least one of an electron transport layer or an electron injection layer. The functional layer 23 comprises a first functional portion 231 and a second functional portion 232 spaced apart from the first functional portion 231. The first functional portion 231 is located on one side of the separator 12 close to the display area 111, and the second functional portion 232 is located on one side of the separator 12 away from the display area 111. Similar to the cathode 13, the two portions of the functional layer 23 on both sides of the separator 12 are also spaced apart. Such a structure is favorable to block water vapor and oxygen from entering the display area 111 through the functional layer 23, thereby reducing the adverse effect of water vapor and oxygen on the display panel and thus improving the display effect of the display panel.

It should be understood that in a case where the functional layer 23 comprises an electron transport layer and an electron injection layer located between the cathode 13 and the electron transport layer, the first functional portion 131 and the second functional portion 132 each comprises two layers, of which one layer is a part of the electron transport layer, and the other layer is a part of the electron injection layer.

In other embodiments, referring to FIG. 1B, the functional layer 23 further comprises at least one of a third functional portion 233 or a fourth functional portion 234. The third functional portion 233 is located between the second separation layer 1212 of the separation portion 121 and the third cathode portion 133, and the fourth functional portion 234 is located between two adjacent separation portions 121 and located between the fourth cathode portion 134 and the base substrate 11. Such a structure is more favorable to block water vapor and oxygen from entering the display area 111 through the functional layer 23, thereby further reducing the adverse effect of water vapor and oxygen on the display panel, and thus further improving the display effect of the display panel.

In addition, in a case where the display panel further comprises other layers (for example, an organic cover layer) between the cathode 13 and the encapsulation layer 16, the other layers may also be partitioned by the separator 12, thereby further improving the display effect of the display panel.

In addition to the first separation layer 1211 and the second separation layer 1212, each separation portion 121 may also comprise other layers, which will be described below in conjunction with different embodiments.

In some embodiments, referring to FIG. 1B, each separation portion 121 further comprises a third separation layer 1213 located between the first separation layer 1211 and the base substrate 11. The first orthographic projection 1211' is within the third orthographic projection of the third separation layer 1213 on the base substrate 11. For example, the third orthographic projection may completely overlap with the second orthographic projection 1212' shown in FIG. 1C. In some embodiments, the material of the third separation layer 1213 may comprise titanium.

In other embodiments, referring to FIG. 1B, each separation portion 121 further comprises a support layer 1214 located between the third separation layer 1213 and the base substrate 11. Here, the first orthographic projection 1211', the second orthographic projection 1212', and the third orthographic projection are within the orthographic projection of the support layer 1214 on the base substrate 11. In this manner, the possibility of collapse of the first separation layer 1211, the second separation layer 1212, and the third separation layer 1213 is reduced, and the reliability of the separation portion 121 is improved, thereby further improving the display effect of the display panel.

In still other embodiments, referring to FIG. 1B, each separation portion 121 further comprises a first conductive portion 1215 located on one side of the second separation layer 1212 away from the base substrate 11. Here, the orthographic projection of the first conductive portion 1215 on the base substrate 11 is within the second orthographic projection 1212'. For example, the material of the first conductive portion 1215 comprises a transparent material, for example, indium tin oxide (ITO) or the like. It should be understood that in a case where the separation portion 121 comprises the first conductive portion 1215, the third cathode portion 133 of the cathode 13 is located on one side of the first conductive portion 1215 away from the base substrate 11, and the third functional portion 233 of the functional layer 23 is located between the first conductive portion 1215 and the second separation layer 1212.

In some embodiments, the display panel further comprises a power line 20 and a second conductive portion 21 located at the peripheral area 112. The power line 20 is located between the support layer 1214 and the base substrate 11 and the power line 20 is connected to each separation portion 121. The second conductive portion 21 is located between the separator 12 and the display area 111, and the second conductive portion 21 is located between the first cathode portion 131 and the power line 20. Here, the second conductive portion 21 is in contact with the first cathode portion 131, and connected to the power line 20. In other words, the first cathode portion 131 is connected to the power line 20 via the second conductive portion 21. For example, the material of the second conductive portion 21 comprises a transparent material, for example, ITO or the like.

With such a structure, each separation portion 121 is connected to the power line 20 which is connected to the first cathode portion 131, which helps to discharge static electricity, thereby reducing the adverse effect of static electricity on the display panel, and thus further improving the display effect of the display panel.

Hereinafter, some implementations of the connection between the separation portion 121 and the power line 20 will be introduced.

In some implementations, referring to FIG. 1B, the display panel further comprises a first insulating layer IL1, a second insulating layer IL2, a third insulating layer IL3, and a fourth insulating layer IL4. Each separation portion 121 further comprises a first connecting portion CP1, a second connecting portion CP2, and a third connecting portion CP3.

The first insulating layer IL1 comprises a first insulating portion IL11 located at the peripheral area 112, the second insulating layer IL2 comprises a second insulating portion IL21 located at the peripheral area 112, and the third insulating layer IL3 comprises a third insulating portion IL31 located at the peripheral area 112, and the fourth insulating layer IL4 comprises a fourth insulating portion IL41 located at the peripheral area 112.

The first insulating portion IL11 is located between the support layer 1214 and the power line 20, the second insulating portion IL21 is located between the support layer 1214 and the first insulating portion IL11, the third insulating portion IL31 is located between the support layer 1214 and the third separation layer 1213, and the fourth insulating portion IL41 is located between the second separation layer 1212 and the first conductive portion 1215.

The first connecting portion CP1 penetrates through the second insulating portion IL21 and the first insulating portion IL11 and is connected to the support layer 1214 and the power line 20. In some embodiments, the first connecting portion CP1 and the support layer 1214 are integrally provided.

The second connecting portion CP2 penetrates through the third insulating portion IL31 and is connected to the third separation layer 1213 and the support layer 1214. In some embodiments, the second connecting portion CP2 and the third separation layer 1213 are integrally provided.

The third connecting portion CP3 penetrates through the fourth insulating portion IL41 and is connected to the first conductive portion 1215 and the second separation layer 1212. In some embodiments, the third connecting portion CP3 and the first conductive portion 1215 are integrally provided. It should be understood that, in a case where the display panel further comprises the third functional portion 233, the third connecting portion CP3 also penetrates through the third functional portion 233.

In the above implementations, the separation portion 121 is connected to the power line 20 via the first connecting portion CP1, and various layers in the separation portion 121 are connected to each other via the second connecting portion CP2 and the third connecting portion CP3. The static electricity can be conducted to the power line 20 more effectively.

Hereinafter, some implementations of the connection between the second conductive portion 21 and the power line 20 will be introduced.

In some implementations, referring to FIG. 1B, the display panel further comprises a connecting layer 22, at least one fourth connecting portion CP4, at least one fifth connecting portion CP5, and at least one sixth connecting portion CP6. In some embodiments, the display panel comprises a plurality of fourth connecting portions CP4, a plurality of fifth connecting portions CP5, and a plurality of sixth connecting portions CP6.

The connecting layer 22 is located between the second conductive portion 21 and the power line 20 and is located between the separator 12 and the display area 111. The connecting layer 22 comprises a first connecting layer 221 located between the second conductive portion 21 and the power line 20, and a second connecting layer 222 located between the second conductive portion 21 and the first connecting layer 221. In some embodiments, the first connecting layer 221 and the second connecting layer 222 each comprises a stacked layer, for example, Ti/Al/Ti.

The fourth connecting portion CP4 penetrates through the second insulating portion IL21 and the first insulating portion IL11 and is connected to the first connecting layer 221 and the power line 20. In some embodiments, the fourth connecting portion CP4 and the first connecting layer 221 are integrally provided.

The fifth connecting portion CP5 penetrates through the third insulating portion IL31 and is connected to the second connecting layer 222 and the first connecting layer 221. In some embodiments, the fifth connecting portion CP5 and the second connecting layer 222 are integrally provided.

The sixth connecting portion CP6 penetrates through the fourth insulating portion IL41 and is connected to the second conductive portion 21 and the second connecting layer 222. In some embodiments, the sixth connecting portion CP6 and the second conductive portion 21 are integrally provided. It should be understood that, in a case where the display panel further comprises the first functional portion 231, the sixth connecting portion CP6 also penetrates through the first functional portion 231.

In the above implementations, the second conductive portion 21 is connected to the power line 20 via the first connecting layer 221 and the second connecting layer 222, which is favorable to reduce the resistance of the connecting layer 22 and thus improve the uniformity of the power signal applied via the power line 20.

It can be understood that the power signal applied via the power line 20 can be transmitted to the first cathode portion 131 via the connecting layer 22 and the second conductive portion 21, and then applied to sub-pixels P located at the display area 111.

In some embodiments, the orthographic projection of the first connecting layer 221 on the base substrate 11 is within the orthographic projection of the second connecting layer 222 on the base substrate 11. In this way, it is ensured that the second connecting layer 222 can be connected to the first connecting layer 221 via the fifth connecting portion CP5, thereby ensuring that the second conductive portion 21 is connected to the power line 20.

It should be understood that certain layer(s) located at the peripheral area 112 and certain layer(s) of the sub-pixels located at the display area 111 may be located in a same layer. It should also be understood that certain layer(s) located at the peripheral area 112 may extend from the display area 111 to the peripheral area 112, which will be described in conjunction with FIG. 2.

Figure 2:
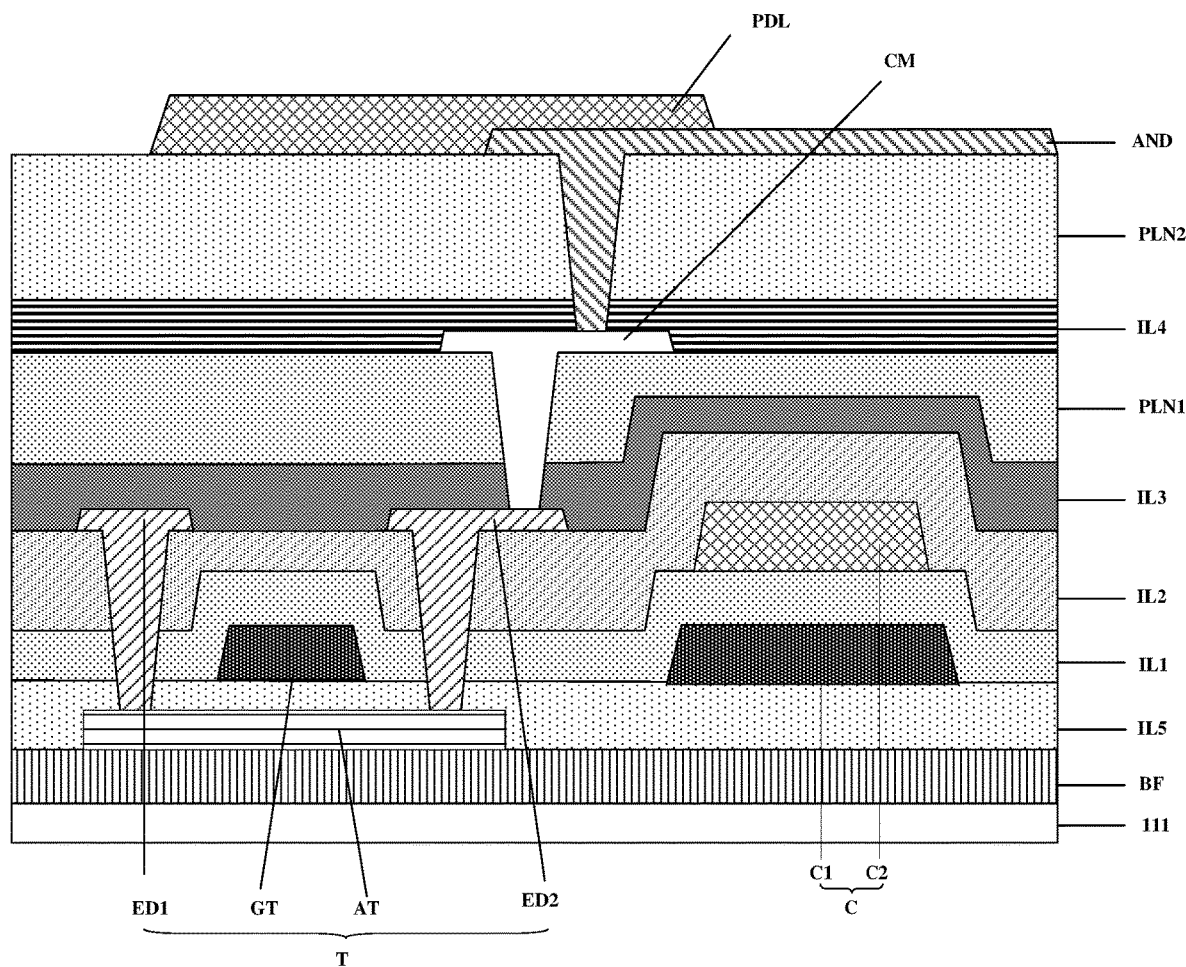
FIG. 2 is a schematic cross-sectional view showing a sub-pixel in the display panel according to some embodiments of the present disclosure.

FIG. 2 is a schematic cross-sectional view showing a sub-pixel in the display panel according to some embodiments of the present disclosure.

As shown in FIG. 2, a sub-pixel P comprises a pixel driving circuit, which may comprise a thin film transistor T and a capacitor C. It should be understood that the pixel driving circuit may also comprise other thin film transistors. For example, the pixel driving circuit may comprise six thin film transistors and one capacitor C (6T1C); for another example, the pixel driving circuit may comprise seven thin film transistors and one capacitor C (7T1C).

The thin film transistor T comprises an active layer AT located on one side of the base substrate 11, a fifth insulating layer IL5 located on one side of the active layer AT away from the base substrate 11, a gate GT located on one side of the fifth insulating layer IL5 away from the base substrate 11, and a first electrode ED1 and a second electrode ED2 which penetrate through the first insulating layer IL1 and the second insulating layer IL2. Here, the first insulating layer IL1 is located on one side of the gate GT away from the base substrate 11, and the second insulating layer IL2 is located on one side of the first insulating layer IL1 away from the base substrate 11.

The capacitor C comprises a first electrode plate C1 located between the fifth insulating layer IL5 and the first insulating layer IL1, and a second electrode plate C2 located between the first insulating layer IL1 and the second insulating layer IL2. It should be understood that the capacitor C further comprises the first insulating layer IL1 located between the first electrode plate C1 and the second electrode plate C2. For example, the first electrode plate C1 and the gate GT may be located in a same layer, that is, formed by patterning a same material layer. As some implementations, the material of at least one of the first electrode plate C1 or the second electrode plate C2 may comprise metal or alloy.

The sub-pixel P further comprises an anode AND, which is connected to the second electrode ED2 of the thin film transistor T via a connecting member CM. The connecting member CM is connected to the second electrode ED2 via a via hole that penetrates through the third insulating layer IL3 and the first planarization layer PLN1, and the anode AND is connected to the connecting member CM via a via hole that penetrates through the fourth insulating layer IL4 and the second planarization layer PLN2. Here, the third insulating layer IL3 covers the first electrode ED1 and the second electrode ED2 and is located on one side of the second insulating layer IL2 away from the base substrate 11, the first planarization layer PLN1 is located on one side of the third insulating layer IL3 away from the base substrate 11, the fourth insulating layer IL4 is located on one side of the first planarization layer PLN1 away from the base substrate 11, the connecting member CM is located between the first planarization layer PLN1 and the fourth insulating layer IL4, the second planarization layer PLN2 is located on one side of the fourth insulating layer IL4 away from the base substrate 11, and the anode AND is located on one side of the second planarization layer PLN2 away from the base substrate 11.

It should be understood that the sub-pixel P further comprises a light-emitting layer (not shown in FIG. 2) located on one side of the anode AND away from the base substrate 11 and the cathode 13 shown in FIG. 1B. For example, more than one sub-pixel P may share the cathode 13.

As some implementations, the material of the active layer AT may comprise one or more of amorphous indium gallium zinc oxide (a-IGZO), zinc oxynitride (ZnON), indium zinc tin oxide (IZTO), amorphous silicon (a-Si), polysilicon (p-Si), sexithiophene and polythiophene. As some implementations, the material of each of the first insulating layer IL1, the second insulating layer IL2, the third insulating layer IL3, the fourth insulating layer IL4, and the fifth insulating layer IL5 may comprise inorganic material such as silicon oxide, silicon nitride, or silicon oxynitride. As some implementations, the material of each of the first planarization layer PLN1 and the second planarization layer PLN2 may comprise organic material such as polyimide. As some implementations, the material of at least one of the first electrode ED1 or the second electrode ED2 may comprise metal or alloy. For example, the first electrode ED1 and the second electrode ED1 may comprise a stack, which may be Ti/Al/Ti, for example.

FIG. 2 also shows a pixel defining layer PDL for defining the sub-pixels P and a buffer layer BF in the display panel. The buffer layer BF is located between the base substrate 11 and the active layer AT and used for blocking water vapor and oxygen from entering the active layer AT.

In some embodiments, the power line 20 shown in FIG. 1B may be located in a same layer as the gate GT shown in FIG. 2. In some embodiments, the support layer 1214 and the first connecting layer 221 which are shown in FIG. 1B may be located in a same layer as the first electrode ED1 and the second electrode ED2 which are shown in FIG. 2.

In some embodiments, the second connecting layer 221 shown in FIG. 1B may be located in a same layer as the connecting member CM shown in FIG. 2. In a case where the connecting member CM comprises a stack, the first separation layer 1211, the second separation layer 1212, and the third separation layer 1213 which are shown in FIG. 1B may be respectively located in a same layer as a certain layer in the stack of the connecting member CM.

In some embodiments, the first conductive portion 1215 and the second conductive portion 21 which are shown in FIG. 1B may be located in a same layer as the anode AND shown in FIG. 2.

Figure 3:
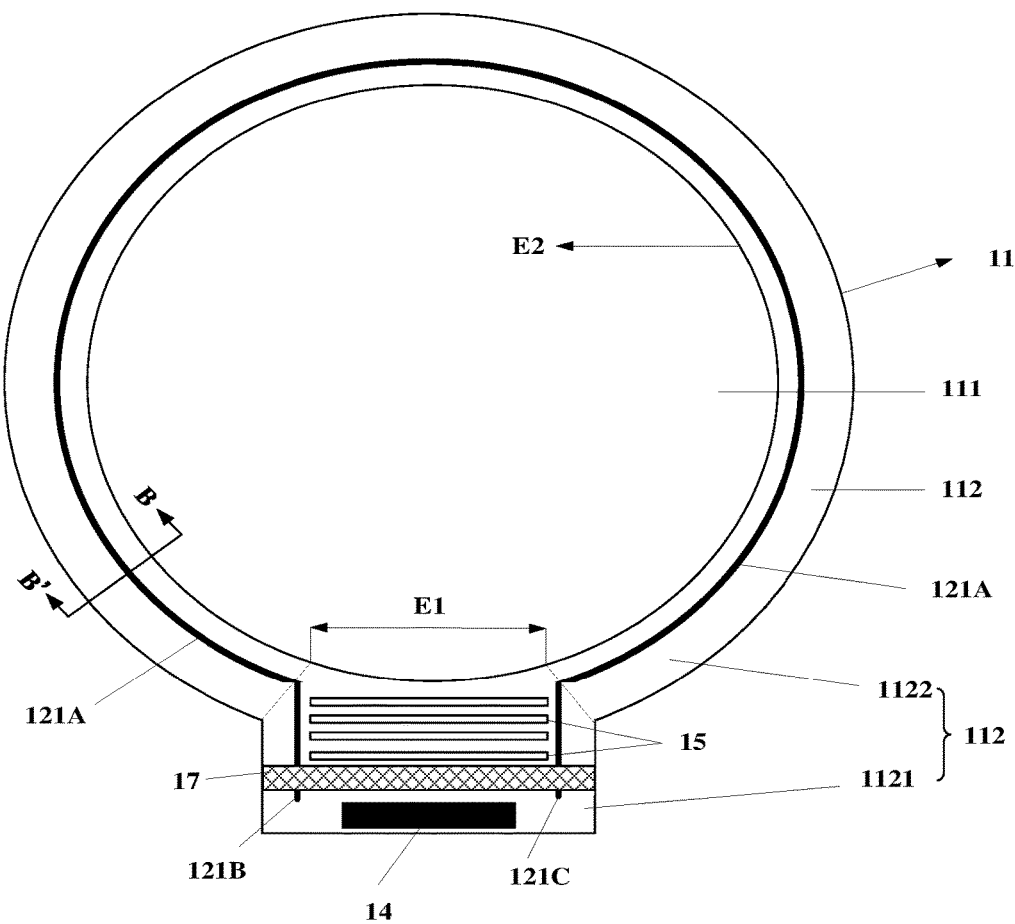
FIG. 3 is a schematic top view showing a display panel according to other embodiments of the present disclosure.

FIG. 3 is a schematic top view showing a display panel according to other embodiments of the present disclosure. It should be noted that a schematic cross-sectional view taken along B-B' shown in FIG. 3 is still as shown in FIG. 1B.

As shown in FIG. 3, the peripheral area 112 comprises a bonding area 1121 and a non-bonding area 1122 other than the bonding area 1121. Here, the bonding area 1121 surrounds the first edge E1 of the edge of the display area 111, and the non-bonding area 1122 surrounds the second edge E2 of the edge of the display area 111 other than the first edge E1. Each separation portion 121 comprises a first separation portion 121A located at the no-bonding area 1122 and surrounding the second edge E2. It should be noted that FIG. 3 only schematically shows one separation portion 121, and for the structures of other separation portions 121, reference can be made to the separation portion 121 in FIG. 3.

It should be understood that the bonding area 1121 is used for establishing an electrical connection with an external circuit (for example, a circuit board, an integrated circuit chip, etc.) in a bonding manner. The bonding area 1121 may be provided with a pad 14 and other signal line(s). The external circuit can provide a signal to the display panel via the pad 114.

It should also be understood that the boundary between the bonding area 1121 and the non-bonding area 1122 shown in FIG. 3 is only schematic. Those skilled in the art understand that the frame size of the bonding area 1121 is generally greater than that of the non-bonding area 1122, that is, the minimum distance between an edge of the bonding area 1121 away from the display area 111 and the edge of the display area 111 is greater than the minimum distance between an edge of the non-bonding area 1122 away from the display area 111 and the edge of the display area 111. Therefore, according to the frame size, it can be determined that a part of the peripheral area 112 is the bonding area 1121, and the remaining part of the peripheral area 112 is the non-bonding area 1122.

In the above embodiments, the first separation portion 121A surrounding the second edge E2 can block water vapor and oxygen from entering the display area 111 via the cathode 13, thereby improving the display effect of the display panel.

In some embodiments, referring to FIG. 3, each separation portion 121 further comprises a second separation portion 121B and a third separation portion 121C which are located at the bonding area 1121. The second separation portion 121B is connected to one end of the first separation portion 121A, and the third separation portion 121C is connected to the other end of the first separation portion 121A. Here, the third separation portion 121C and the second separation portion 121B both extend in a direction away from the display area 111.

It can be understood that the starting point and the ending point of the first separation portion 121A extending around the second edge E2 are the two ends of the first separation portion 121A. The two ends of the first separation portion 121A are shown in FIG. 3 as positions where the first separation portion 121A intersects with the two dashed lines.

In addition, although the second separation portion 121B and the third separation portion 121C shown in FIG. 3 extend in a same direction, this is not restrictive.

In the above embodiments, each separation portion 121 further comprises a second separation portion 121B and a third separation portion 121C located at the peripheral area. Accordingly, water vapor and oxygen can be blocked from entering the display area 111 via the cathode 13 more effectively, thereby further improving the display effect of the display panel.

Figure 4A:
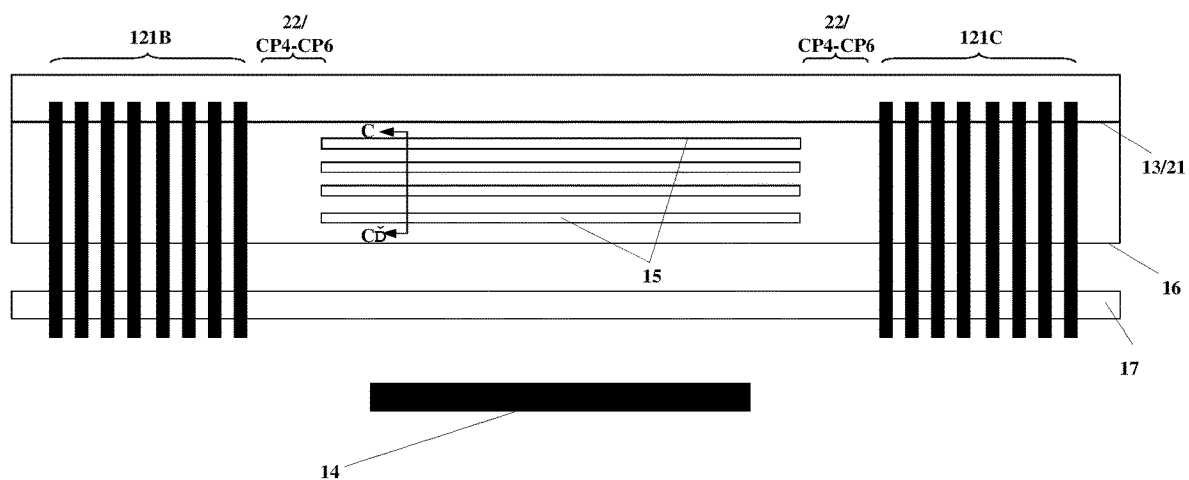
FIG. 4A is a partially enlarged schematic view of the bonding area shown in FIG. 3.
Figure 4B:
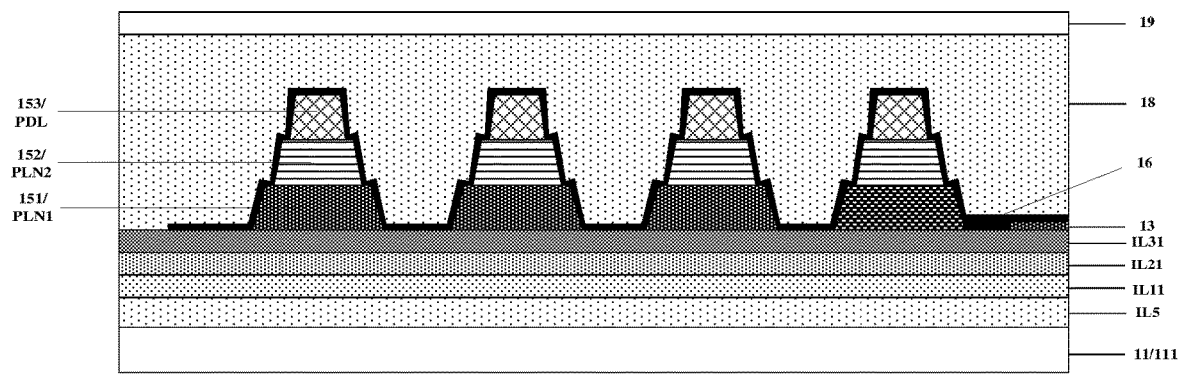
FIG. 4B is a schematic cross-sectional view taken along C-C' shown in FIG. 4A.

FIG. 4A is a partially enlarged schematic view of the bonding area shown in FIG. 3. FIG. 4B is a schematic cross-sectional view taken along C-C' shown in FIG. 4A.

In some embodiments, referring to FIGS. 4A, 3 and 1B, the display panel further comprises the pad 14 and at least one dam 15.

In some embodiments, the display panel comprises a plurality of dams 15 arranged at intervals in a direction from the first edge E1 to the pad 14. As shown in FIG. 4B, for example, the dam 15 may comprise a first layer 151, a second layer 152, and a third layer 153 that are sequentially located on the third insulating layer IL3. For example, the first layer 151 may be located in a same layer as the first planarization layer PLN1, the second layer 152 may be located in a same layer as the second planarization layer PLN2, and the third layer 153 may be located in a same layer as the pixel defining layer PDL.

The pad 14 and the dam 15 are located at the bonding area 1121. The dam 15 is located between the first edge E1 and the pad 14, and the dam 15 extends in a direction from the second separation portion 121B to the third separation portion 121C.

The encapsulation layer 16 is located on one side of the cathode 13 and the at least one dam 15 away from the base substrate 11. Here, the orthographic projection of the pad 14 on the base substrate 11 is outside the orthographic projection of the encapsulation layer 16 on the base substrate 11, and the orthographic projection of the dam 15 on the base substrate 11 is within the orthographic projection of the encapsulation layer 16 on the base substrate 11. In other words, the pad 14 is not covered by the encapsulation layer 16, and each dam 15 is covered by the encapsulation layer.

In the above embodiments, the dam 15 is provided such that the encapsulation layer 16 extends in a longer path. Accordingly, water vapor and oxygen can be blocked from entering the display area 111 via the encapsulation layer 16 more effectively, and the encapsulation effect of the encapsulation layer is improved, thereby further improving the display effect of the display panel.

In some embodiments, referring to FIG. 4A, the dam 15 is located between the cathode 13 and the pad 14. Accordingly, the possibility of water vapor and oxygen entering the cathode 13 is further reduced, thereby further improving the display effect of the display panel.

In some embodiments, referring to FIGS. 3 and 1B, the display panel further comprises a glue portion 17, a glue layer 18 and a cover plate 19. As shown in FIG. 3, the glue portion 17 is located at the bonding area 1121 and located between the dam 15 and the pad 14. As shown in FIG. 1B, the glue layer 18 is located on one side of the encapsulation layer 16 away from the base substrate 11, and the cover plate 19 is located on one side of the glue layer 18 away from the base substrate 11. The glue portion 17 can reduce the impact on the pad 14 when a glue material is filled to form the glue layer 18, thereby improving the reliability of the display panel.

It should be understood that the display panels provided by different embodiments of the present disclosure may be combined.

Figure 5:
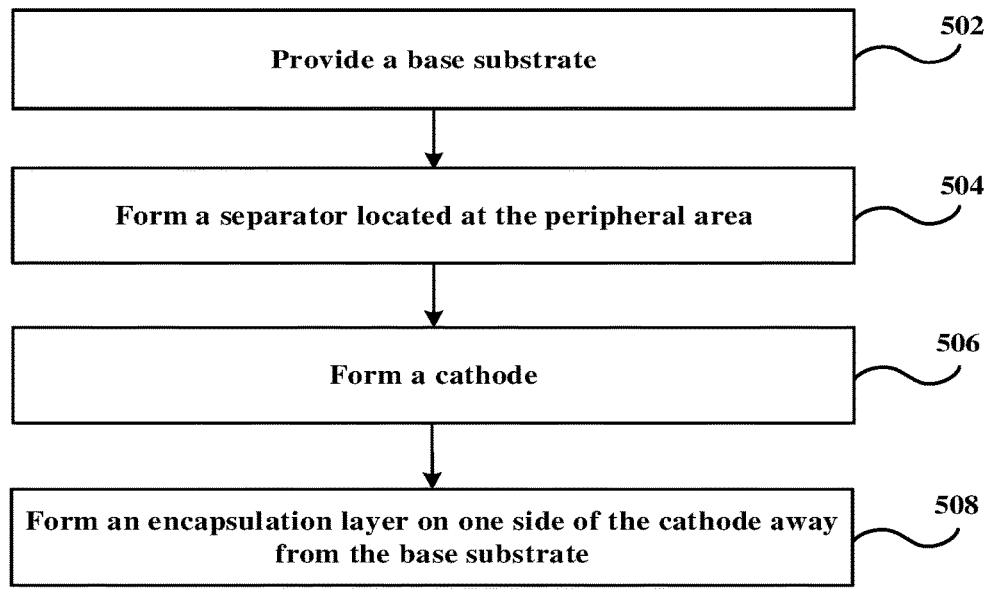
FIG. 5 is a schematic flowchart showing a method for manufacturing a display panel according to some embodiments of the present disclosure.

FIG. 5 is a schematic flowchart showing a method for manufacturing a display panel according to some embodiments of the present disclosure.

At step 502, a base substrate is provided. The base substrate comprises a display area and a peripheral area surrounding the display area.

At step 504, a separator located at the peripheral area is formed.

Here, the separator comprises at least one separation portion at least partially surrounding the display area, and each separation portion comprises a first separation layer and a second separation layer sequentially stacked on the base substrate. The first orthographic projection of the first separation layer on the base substrate is within the second orthographic projection of the second separation layer on the base substrate.

At step 506, a cathode is formed.

Here, the cathode comprises a first cathode portion located on one side of the separator close to the display area and a second cathode portion located on one side of the separator away from the display area, and the second cathode portion is spaced apart from the first cathode portion.

At step 508, an encapsulation layer is formed on one side of the cathode away from the base substrate.

Here, the encapsulation layer comprises a first inorganic layer, a second inorganic layer, and an organic layer located between the first inorganic layer and the second inorganic layer. The edge of the orthographic projection of the first inorganic layer on the base substrate, the edge of the orthographic projection of the organic layer on the base substrate, and the edge of the orthographic projection of the second inorganic layer on the base substrate overlap.

Hereinafter, some implementations of forming the separator will be introduced in conjunction with FIGS. 6A-6C and FIGS. 7A-7D. In these implementations, each separation portion further comprises the third separation layer 1213, the support layer 1214, and the first conductive portion 1215 introduced above.

Figure 6A:
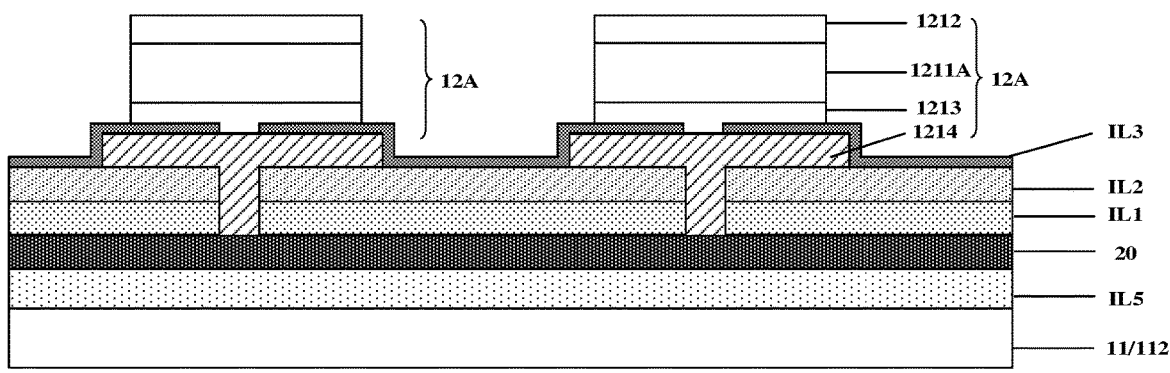
FIGS. 6A-6C are schematic cross-sectional views showing structures obtained at different stages of forming a separator according to some implementations of the present disclosure.
Figure 7A:
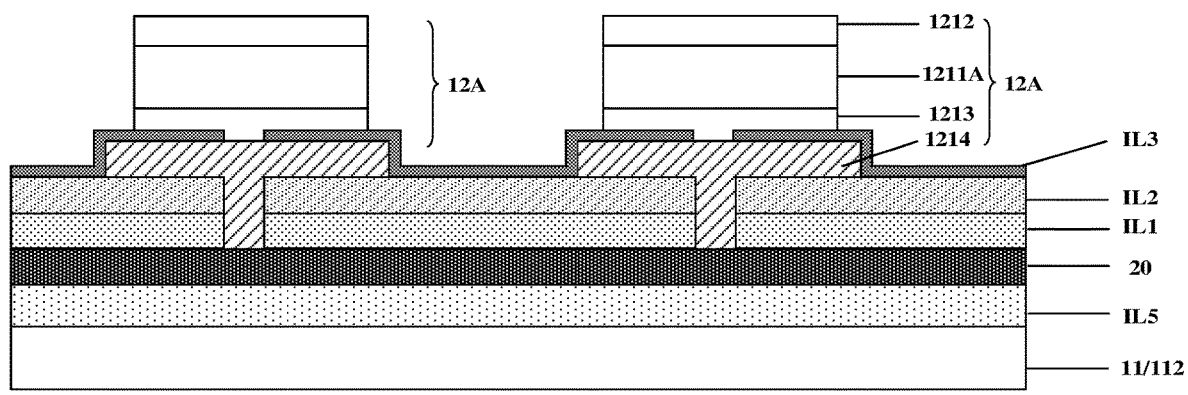
FIGS. 7A-7D are schematic cross-sectional views showing structures obtained at different stages of forming a separator according to other implementations of the present disclosure.

As shown in FIGS. 6A and 7A, at least one initial separator 12A is formed on the base substrate 11. Each initial separator 12A comprises a support layer 1214, a third separation layer 1213, a first initial separation layer 1211A, and a second separation layer 1212 that are sequentially stacked on the base substrate 11. The edge of the orthographic projection of the first initial separation layer 1211A on the base substrate 11 close to the display area 111, the edge of the orthographic projection of the second separation layer 1212 on the base substrate 11 close to the display area 111, and the edge of the orthographic projection of the third separation layer 1213 on the base substrate 11 close to the display area 111 overlap. The edge of the orthographic projection of the first initial separation layer 1211A on the base substrate 11 away from the display area 111, the edge of the orthographic projection of the second separation layer 1212 on the base substrate 11 away from the display area 111, and the edge of the orthographic projection of the third separation layer 1213 on the base substrate 11 away from the display area 111 overlap.

Next, a first conductive portion 1215 is formed, and at least one of the first side surface S1 of the first initial separation layer 1211A close to the display area 111 or the second side surface S2 away from the display area 111 is etched to form a first separation layer 1211.

Figure 6B:
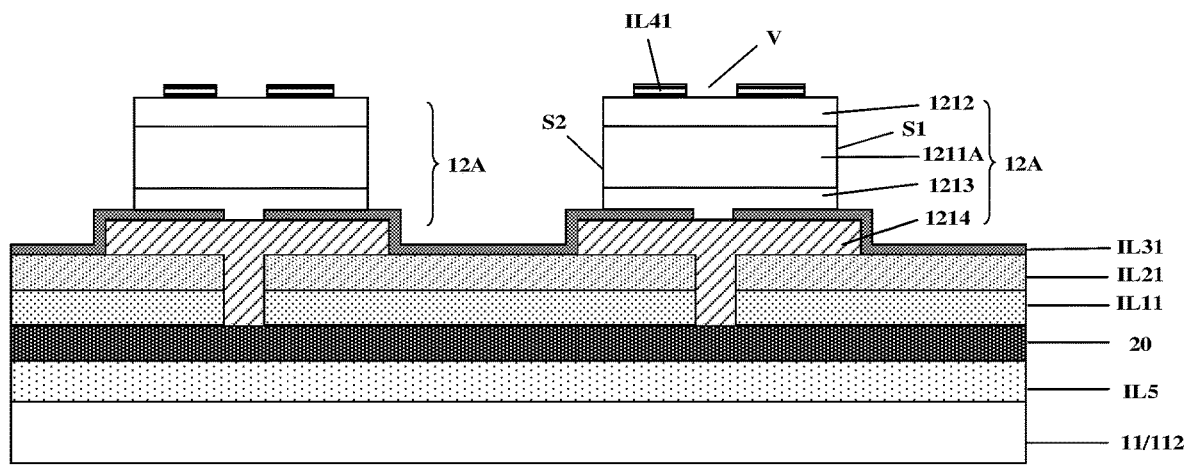
Figure 6C:
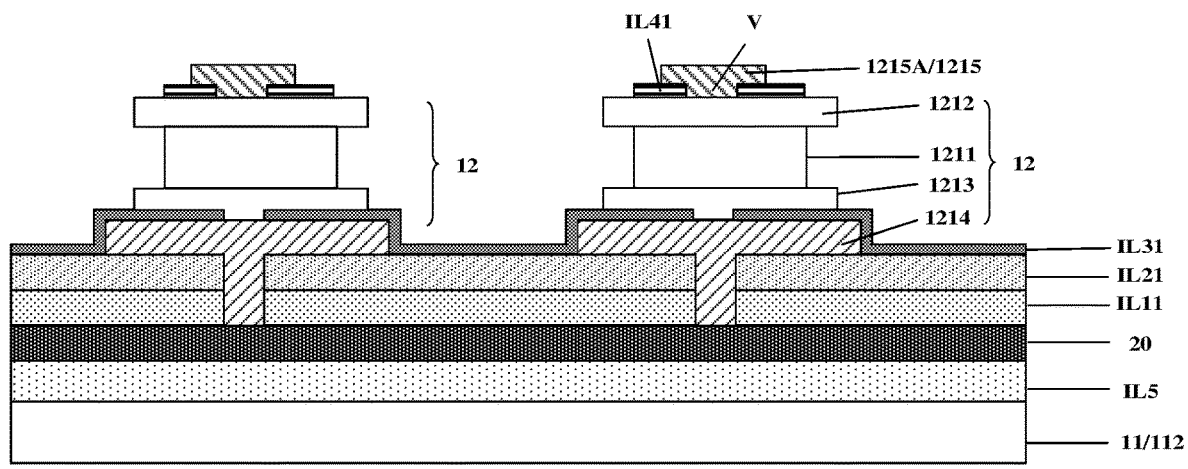

First, some implementations of forming the first conductive portion 1215 and forming the first separation layer 1211 will be introduced in conjunction with FIGS. 6B-6C.

As shown in FIG. 6B, a fourth insulating portion IL41 is formed on one side of the second separation layer 1212 away from the base substrate 11. The fourth insulating portion IL41 defines an opening V exposing a part of a surface of the second isolation layer 1212 away from the base substrate 11. In addition, after the fourth insulating portion IL41 is formed, the first side surface S1 and the second side surface S2 are exposed.

As shown in FIG. 6C, a conductive material layer 1215A partially located in the opening V and covering the first side surface S1 and the second side surface S2 is formed, and then a wet etching is performed on the conductive material layer 1215A to obtain the first conductive portion 1215 partially located in the opening V. Here, the wet etching simultaneously causes at least one of the first side surface S1 or the second side surface S2 to be etched to obtain the first separation layer 1211.

That is, the first conductive portion 1215 is formed by the same wet etching process for etching the first side surface S1 and the second side surface S2.

Hereinafter, other implementations of forming the first conductive portion 1215 and forming the first separation layer 1211 will be introduced in conjunction with FIGS. 7B-7C.

Figure 7B:
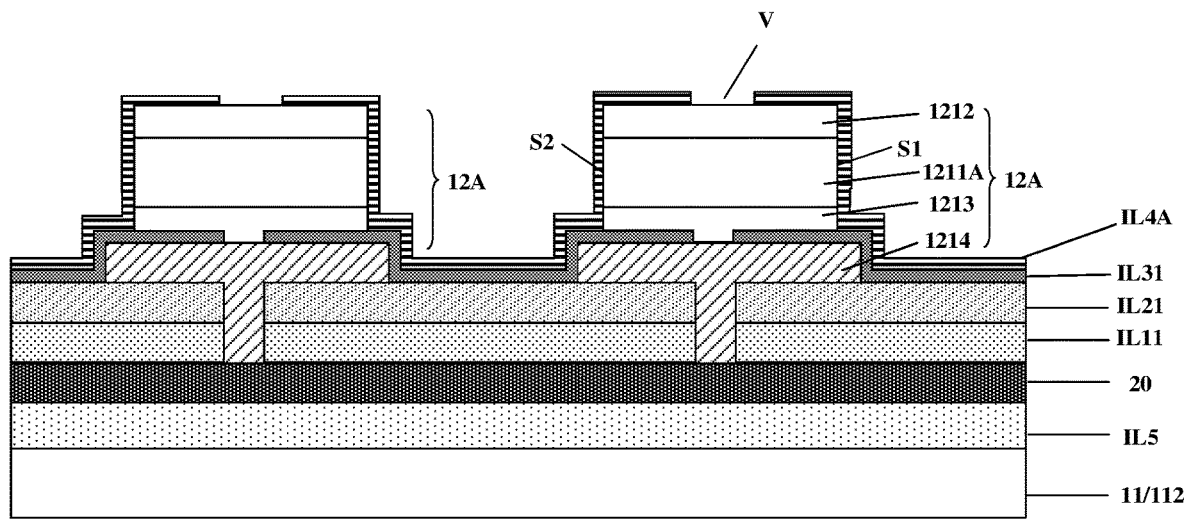

As shown in FIG. 7B, a fourth insulating material layer IL4A covering the first side surface S1 and the second side surface S2 is formed. The fourth insulating material layer IL4A defines an opening V exposing a part of a surface of the second separation layer 1212 away from the base substrate 11.

Figure 7C:
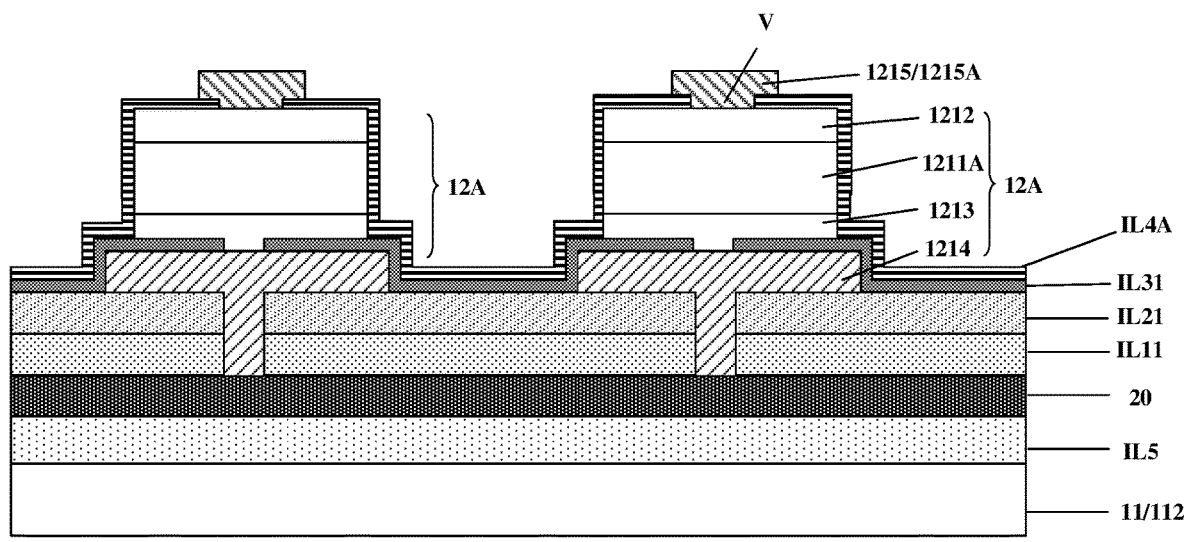

As shown in FIG. 7C, a conductive material layer 1215A partially located in the opening V and covering the fourth insulating material layer IL4A is formed, and then a first wet etching is performed on the conductive material layer 1215A to obtain the first conductive portion 1215 partially located in the opening V.

Figure 7D:
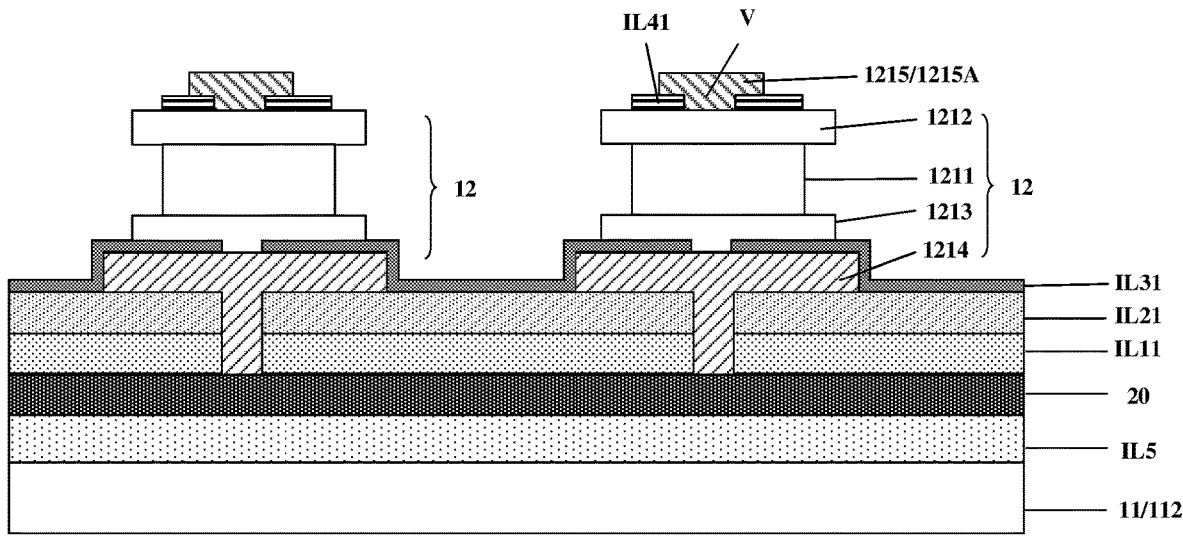

As shown in FIG. 7D, a dry etching is performed on the fourth insulating material layer IL4A to expose the first side surface S1 and the second side surface S2. Then, a second wet etching is performed on at least one of the first side surface S1 or the second side surface S2 to obtain the first separation layer 1211.

That is, the first conductive portion 1215 is formed by another wet etching process different from the wet etching for etching the first side surface S1 and the second side surface S2.

Figure 8:
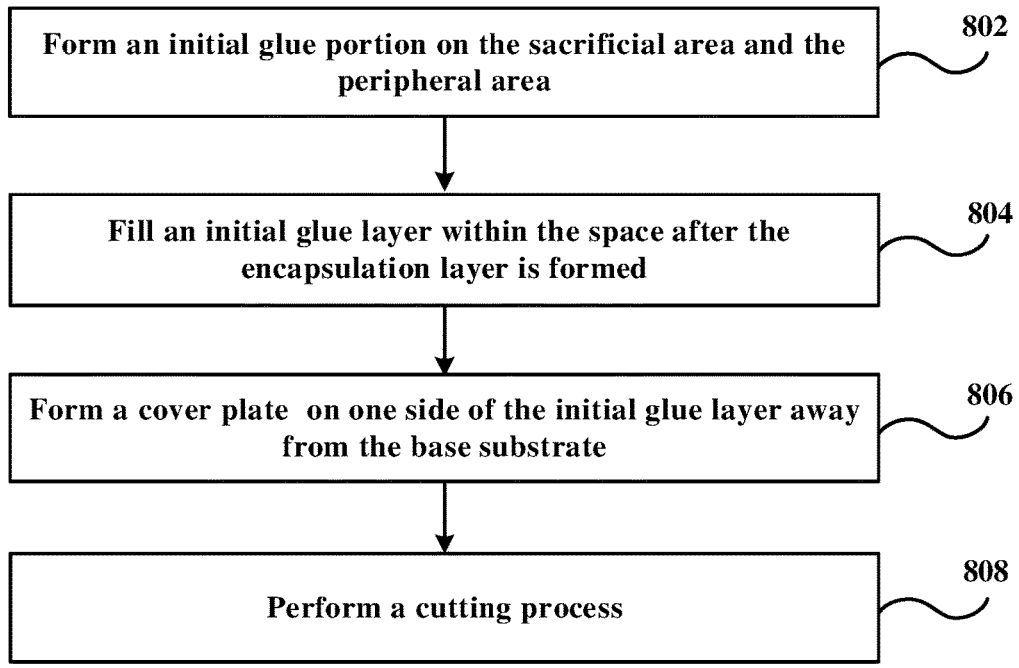
FIG. 8 is a schematic flowchart showing a method for manufacturing a display panel according to other embodiments of the present disclosure.
Figure 9A:
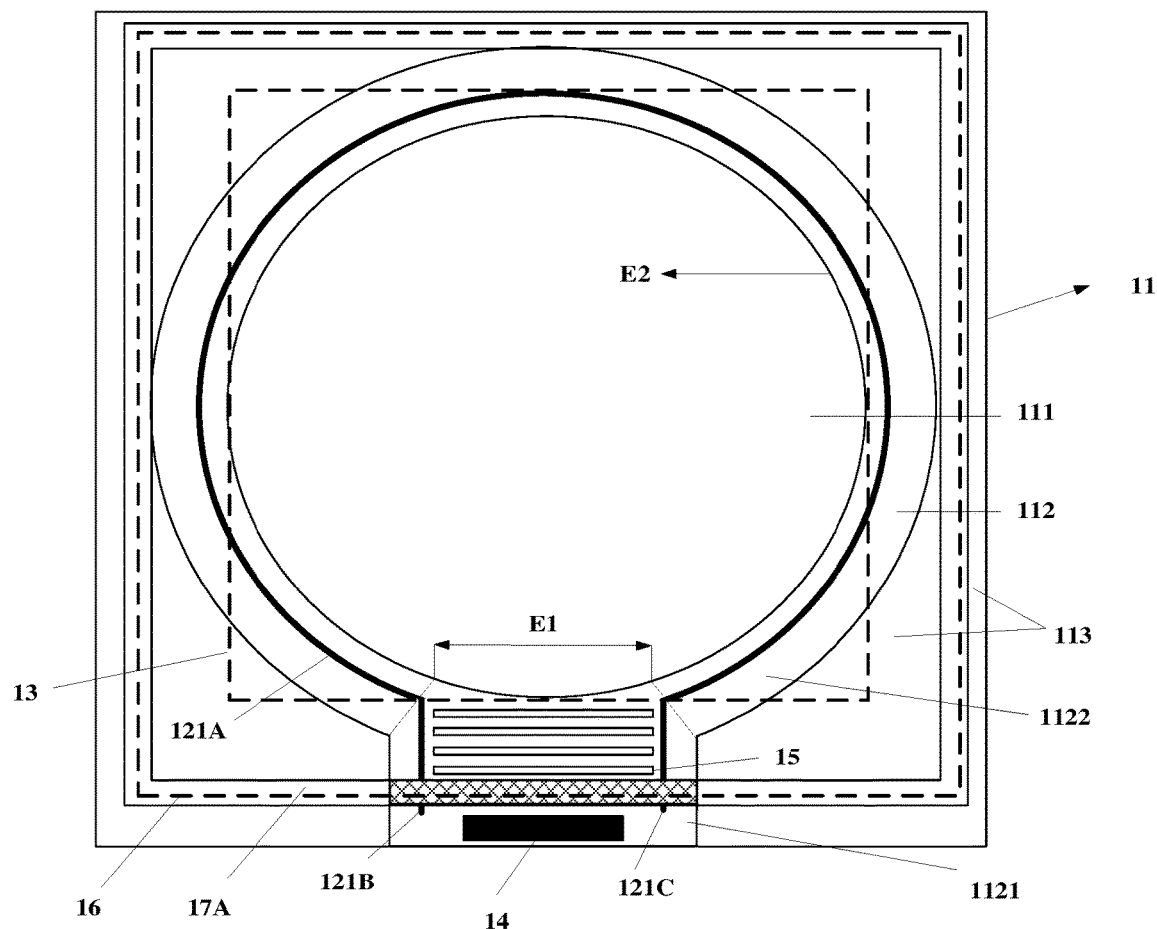
FIGS. 9A and 9B are schematic top views showing a display panel according to still other embodiments of the present disclosure.
Figure 9B:
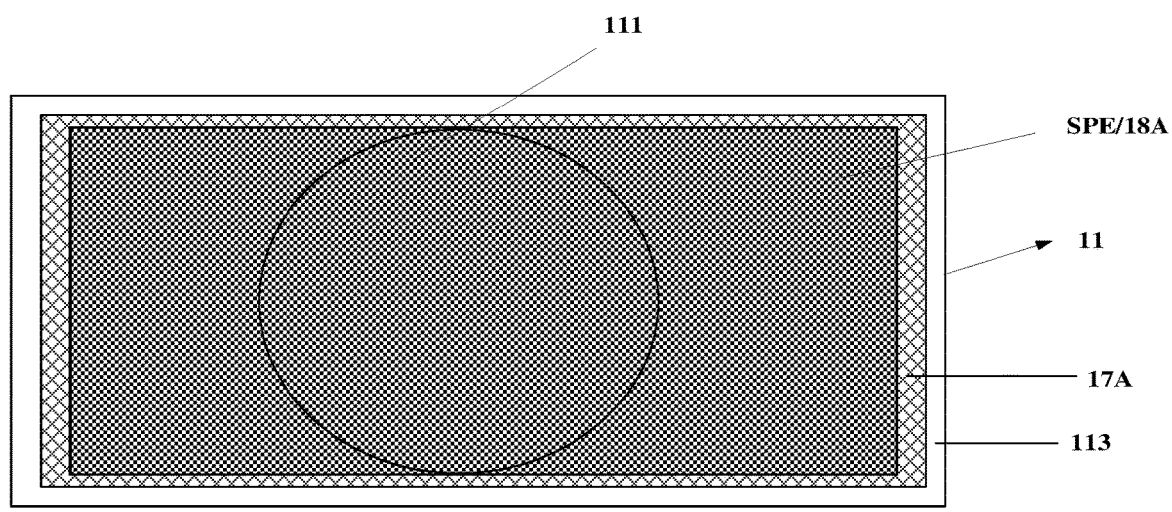

FIG. 8 is a schematic flowchart showing a method for manufacturing a display panel according to other embodiments of the present disclosure. FIGS. 9A and 9B are schematic top views showing a display panel according to still other embodiments of the present disclosure.

In some embodiments, the method shown in FIG. 5 further comprises step 802 to step 808 shown in FIG. 8. In addition, the base substrate 11 further comprises a sacrificial area 113, as shown in FIGS. 9A and 9B.

Hereinafter, the method for manufacturing a display panel will be described in conjunction with FIGS. 8, 9A and 9B.

At step 802, an initial glue portion 17A is formed on the sacrificial area 113 and the peripheral area 112. The display area 111 is within the space SPE defined by the initial glue portion 17A. The orthographic projection of the initial glue portion 17A on the base substrate 11 is a regular pattern. Here, the regular pattern may be, for example, a square as shown in FIG. 9A, or a rectangle as shown in FIG. 9B.

At step 804, after the encapsulation layer 16 is formed, an initial glue layer 18A is filled within the space SPE, as shown in FIG. 9B.

At step 806, a cover plate 19 is formed on one side of the initial glue layer 18A away from the base substrate 11. For the cover 19, reference may be made to FIG. 1B, for example.

At step 808, a cutting process is performed to remove the sacrificial area 113, a part of the initial glue portion 17A located on the sacrificial area 113, a part of the initial glue layer 18A located above the sacrificial area 113, and a part of the cover plate 19 located above the sacrificial area 113 to form the display panel shown in FIGS. 3 and 1B. Here, a part of the initial glue portion 17A located at the peripheral area 112 serves as the glue portion 17, and the remaining part of the initial glue layer 18A serves as the glue layer 18.

In the above embodiments, since the initial glue portion 17A is formed, the initial glue layer 18A may be more uniformly filled, which reduces bubbles in the glue layer 18 and improves the encapsulation effect of the display panel.

The present disclosure also provides a display device, which may comprise the display panel according to any some of the above embodiments. In some embodiments, the display device may be any product or member having a display function, such as a smart wearable device (for example, a smart watch), a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalent substitution of part of the technical features can be made without departing from the scope and spirit of the present disclosure. The scope of the disclosure is defined by the following claims.

What is claimed is:

1. A display panel, comprising:
   a base substrate comprising a display area and a peripheral area surrounding the display area, wherein the peripheral area comprises a bonding area and a non-bonding area other than the bonding area, wherein the bonding area surrounds a first edge of an edge of the display area, and the non-bonding area surrounds a second edge of the edge of the display area other than the first edge;
   a separator located at the peripheral area, the separator comprising at least one separation portion at least partially surrounding the display area, each of the at least one separation portion comprising a first separation portion located at the non-bonding area and surrounding the second edge, wherein each of the at least one separation portion comprises a first separation layer and a second separation layer sequentially stacked on the base substrate, and a first orthographic projection of the first separation layer on the base substrate is within a second orthographic projection of the second separation layer on the base substrate;
   a cathode comprising:
   a first cathode portion located on one side of the separator close to the display area, and
   a second cathode portion located on one side of the separator away from the display area and spaced apart from the first cathode portion; and
   an encapsulation layer located on one side of the cathode away from the base substrate, and comprising a first inorganic layer, a second inorganic layer, and an organic layer located between the first inorganic layer and the second inorganic layer, wherein an edge of an orthographic projection of the first inorganic layer on the base substrate, an edge of an orthographic projection of the organic layer on the base substrate, and an edge of an orthographic projection of the second inorganic layer on the base substrate overlap.

2. The display panel according to claim 1, wherein each of the at least one separation portion further comprises:
   a second separation portion located at the bonding area and connected to one end of the first separation portion; and
   a third separation portion located at the bonding area and connected to the other end of the first separation portion, wherein the third separation portion and the second separation portion each extends in a direction away from the display area.

3. The display panel according to claim 2, further comprising:
   a pad located at the bonding area; and
   at least one dam located at the bonding area and located between the first edge and the pad, wherein the at least one dam extends along a direction from the second separation portion to the third separation portion, wherein:
   the encapsulation layer is located on one side of the at least one dam away from the base substrate,
   an orthographic projection of the pad on the base substrate is outside an orthographic projection of the encapsulation layer on the base substrate, and
   an orthographic projection of the at least one dam on the base substrate is within the orthographic projection of the encapsulation layer on the base substrate.

4. The display panel according to claim 3, wherein the at least one dam is located between the cathode and the pad.

5. The display panel according to claim 3, wherein the at least one dam comprises a plurality of dams arranged at intervals in a direction from the first edge to the pad.

6. The display panel according to claim 3, further comprising:
   a glue portion located at the bonding area and located between the at least one dam and the pad;
   a glue layer located on one side of the encapsulation layer away from the base substrate; and
   a cover plate located on one side of the glue layer away from the base substrate.

7. The display panel according to claim 1, wherein each of the at least one separation portion further comprises:

a third separation layer located between the first separation layer and the base substrate, wherein the first orthographic projection is within a third orthographic projection of the third separation layer on the base substrate.

8. The display panel according to claim 7, wherein each of the at least one separation portion further comprises:
a support layer located between the third separation layer and the base substrate, wherein the first orthographic projection, the second orthographic projection, and the third orthographic projection are within an orthographic projection of the support layer on the base substrate.

9. The display panel according to claim 8, wherein each of the at least one separation portion further comprises:
a first conductive portion located on one side of the second separation layer away from the base substrate, wherein an orthographic projection of the first conductive portion on the base substrate is within the second orthographic projection.

10. The display panel according to claim 9, further comprising:
a power line located at the peripheral area, located between the support layer and the base substrate, and connected to each of the at least one separation portion; and
a second conductive portion located between the separator and the display area, located between the first cathode portion and the power line, in contact with the first cathode portion, and connected to the power line.

11. The display panel according to claim 10, further comprising:
a first insulating layer comprising a first insulating portion located at the peripheral area, wherein the first insulating portion is located between the support layer and the power line;
a second insulating layer comprising a second insulating portion located at the peripheral area, wherein the second insulating portion is located between the support layer and the first insulating portion;
a third insulating layer comprising a third insulating portion located at the peripheral area, wherein the third insulating portion is located between the support layer and the third separation layer; and
a fourth insulating layer comprising a fourth insulating portion located at the peripheral area, wherein the fourth insulating portion is located between the second separation layer and the first conductive portion,
wherein each of the at least one separator further comprises:
a first connecting portion penetrating through the second insulating portion and the first insulating portion, and connected to the support layer and the power line,
a second connecting portion penetrating through the third insulating portion, and connected to the third separation layer and the support layer, and
a third connecting portion penetrating through the fourth insulating portion, and connected to the first conductive portion and the second separation layer.

12. The display panel according to claim 11, further comprising:
a connecting layer located between the second conductive portion and the power line, and located between the separator and the display area, the connecting layer comprising:
a first connecting layer located between the second conductive portion and the power line, and a second connecting layer located between the second conductive portion and the first connecting layer;
at least one fourth connecting portion penetrating through the second insulating portion and the first insulating portion, and connected to the first connecting layer and the power line;
at least one fifth connecting portion penetrating through the third insulating portion, and connected to the second connecting layer and the first connecting layer; and
at least one sixth connecting portion penetrating through the fourth insulating portion, and connected to the second conductive portion and the second connecting layer.

13. The display panel according to claim 12, wherein an orthographic projection of the first connecting layer on the base substrate is within an orthographic projection of the second connecting layer on the base substrate.

14. The display panel according to claim 1, wherein the cathode further comprises:
a third cathode portion located on one side of each of the at least one separation portion away from the base substrate, and spaced apart from the first cathode portion and the second cathode portion.

15. The display panel according to claim 14, wherein the at least one separation portion comprises a plurality of separation portions, and the cathode further comprises:
a fourth cathode portion located between two adjacent separation portions of the plurality of separation portions and spaced apart from the third cathode portion.

16. The display panel according to claim 1, further comprising a functional layer located between the cathode and the base substrate, the functional layer comprising at least one of an electron transport layer or an electron injection layer, the functional layer comprising:
a first functional portion located on one side of the separator close to the display area; and
a second functional portion located on one side of the separator away from the display area and spaced apart from the first functional portion.

17. The display panel according to claim 1, wherein:
an edge of the first orthographic projection close to the display area does not overlap with an edge of the second orthographic projection close to the display area; and
an edge of the first orthographic projection away from the display area does not overlap with an edge of the second orthographic projection away from the display area.

18. A display device, comprising the display panel according to claim 1.

19. A method for manufacturing a display panel, comprising:
providing a base substrate comprising a display area and a peripheral area surrounding the display area, wherein the peripheral area comprises a bonding area and a non-bonding area other than the bonding area, wherein the bonding area surrounds a first edge of an edge of the display area, and the non-bonding area surrounds a second edge of the edge of the display area other than the first edge;
forming a separator located at the peripheral area, the separator comprising at least one separation portion at least partially surrounding the display area, each of the at least one separation portion comprising a first separation portion located at the non-bonding area and surrounding the second edge, wherein each of the at least one separation portion comprises a first separation layer and a second separation layer sequentially stacked on the base substrate, and a first orthographic projection of the first separation layer on the base substrate is within a second orthographic projection of the second separation layer on the base substrate;

forming a cathode, the cathode comprising:
- a first cathode portion located on one side of the separator close to the display area, and
- a second cathode portion located on one side of the separator away from the display area and spaced apart from the first cathode portion; and forming an encapsulation layer on one side of the cathode away from the base substrate, the encapsulation layer comprising a first inorganic layer, a second inorganic layer, and an organic layer located between the first inorganic layer and the second inorganic layer, wherein an edge of an orthographic projection of the first inorganic layer on the base substrate, an edge of an orthographic projection of the organic layer on the base substrate, and an edge of an orthographic projection of the second inorganic layer on the base substrate overlap.

* * * * *

UNITED STATES PATENT AND TRADEMARK OFFICE
CERTIFICATE OF CORRECTION

| | | |
|---|---|---|
| PATENT NO. | : 12,232,400 B2 | Page 1 of 1 |
| APPLICATION NO. | : 17/640530 | |
| DATED | : February 18, 2025 | |
| INVENTOR(S) | : Pan Xu et al. | |

It is certified that error appears in the above-identified patent and that said Letters Patent is hereby corrected as shown below:

On the Title Page

Column 2, item (57) Abstract, Line 10, delete "apart" and insert -- spaced apart --

Signed and Sealed this
Fifteenth Day of April, 2025

Coke Morgan Stewart
*Acting Director of the United States Patent and Trademark Office*